(12) United States Patent
Piechocinski et al.

(10) Patent No.: US 10,750,291 B2
(45) Date of Patent: Aug. 18, 2020

(54) MEMS DEVICES AND PROCESSES

(71) Applicant: Cirrus Logic International Semiconductor Ltd., Edinburgh (GB)

(72) Inventors: Marek Sebastian Piechocinski, Edinburgh (GB); Richard Ian Laming, Edinburgh (GB); Tsjerk Hans Hoekstra, Balerno (GB); Colin Robert Jenkins, Linlithgow (GB); Axel Thomsen, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/987,346

(22) Filed: May 23, 2018

(65) Prior Publication Data
US 2018/0352339 A1    Dec. 6, 2018

Related U.S. Application Data

(60) Provisional application No. 62/512,848, filed on May 31, 2017.

(30) Foreign Application Priority Data

Jun. 19, 2017    (GB) .................................. 1709754.4

(51) Int. Cl.
| | |
|---|---|
| *H04R 1/08* | (2006.01) |
| *H04R 9/08* | (2006.01) |
| *H04R 11/04* | (2006.01) |
| *H04R 17/02* | (2006.01) |
| *H04R 21/02* | (2006.01) |
| *H04R 19/04* | (2006.01) |

(Continued)

(52) U.S. Cl.
CPC .......... *H04R 19/04* (2013.01); *B81B 3/0072* (2013.01); *B81B 3/0086* (2013.01); *H04R 19/005* (2013.01); *B81B 2201/0257* (2013.01); *B81B 2203/0127* (2013.01); *B81B 2203/04* (2013.01); *B81B 2207/012* (2013.01); *B81B 2207/015* (2013.01); *H04R 2201/003* (2013.01)

(58) Field of Classification Search
CPC .......... H04R 19/005; H04R 1/08; H04R 9/08; H04R 11/04; H04R 17/02; H04R 21/02
USPC .................................................. 381/175, 176
See application file for complete search history.

(56) References Cited

U.S. PATENT DOCUMENTS

| | | | |
|---|---|---|---|
| 6,535,460 B2* | 3/2003 | Loeppert ............... | B81B 3/0072 367/181 |
| 6,901,804 B2* | 6/2005 | Torkkeli .............. | B81C 1/00158 381/175 |

(Continued)

FOREIGN PATENT DOCUMENTS

| | | |
|---|---|---|
| CN | 206061136 U | 3/2017 |
| GB | 2515836 A | 1/2015 |

OTHER PUBLICATIONS

Combined Search and Examination Report, UKIPO, Application No. GB1709754.4, dated Dec. 14, 2017.

(Continued)

*Primary Examiner* — Suhan Ni
(74) *Attorney, Agent, or Firm* — Jackson Walker L.L.P.

(57) ABSTRACT

The application describes MEMS transducers having a patterned membrane electrode which incorporates a plurality of openings or voids. A conductive element is provided on the surface of the underlying membrane within the opening.

22 Claims, 11 Drawing Sheets

(51) Int. Cl.
*B81B 3/00* (2006.01)
*H04R 19/00* (2006.01)

(56) References Cited

U.S. PATENT DOCUMENTS

| | | | |
|---|---|---|---|
| 7,146,016 B2* | 12/2006 | Pedersen | B81B 3/0072 |
| | | | 381/175 |
| 8,059,842 B2* | 11/2011 | Suzuki | H04R 19/005 |
| | | | 381/175 |
| 8,476,804 B2* | 7/2013 | Hishinuma | H01G 5/16 |
| | | | 310/324 |
| 2010/0020991 A1 | 1/2010 | Chen | |
| 2011/0074248 A1 | 3/2011 | Hishinuma | |
| 2016/0167946 A1 | 6/2016 | Jenkins et al. | |

OTHER PUBLICATIONS

International Search Report and Written Opinion of the International Searching Authority, International Application No. PCT/GB2018/051387, dated Jul. 5, 2018.

Examination Opinion, Taiwan Intellectual Property Office, Application No. 107117983, dated Feb. 26, 2019.

* cited by examiner

MEMS DEVICES AND PROCESSES

TECHNICAL FIELD

This application relates to micro-electro-mechanical system (MEMS) devices and processes, and in particular to a MEMS device and process relating to a transducer, for example a capacitive microphone.

BACKGROUND INFORMATION

MEMS devices are becoming increasingly popular. MEMS transducers, and especially MEMS capacitive microphones, are increasingly being used in portable electronic devices such as mobile telephone and portable computing devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing. A substrate supports at least the membrane(s) and typically the backplate also. In the case of MEMS pressure sensors and microphones the read out is usually accomplished by measuring the capacitance between the membrane and backplate electrodes. In the case of transducers, the device is driven, i.e. biased, by a potential difference provided across the membrane and backplate electrodes.

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110. A plurality of holes, hereinafter referred to as bleed holes 111, connect the first cavity 109 and the second cavity 110.

A plurality of acoustic holes 12 are arranged in the back-plate 4 so as to allow free movement of air molecules through the back plate, such that the second cavity 10 forms part of an acoustic volume with a space on the other side of the back-plate. The membrane 11 is thus supported between two volumes, one volume comprising cavities 9 and substrate cavity 8 and another volume comprising cavity 11 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 112 in the backplate 104. In such a case the substrate cavity 108 may be sized to provide at least a significant part of a suitable back-volume. In other applications, the microphone may be arranged so that sound may be received via the substrate cavity 108 in use, i.e. the substrate cavity forms part of an acoustic channel to the membrane and part of the front volume. In such applications the backplate 4 forms part of the back-volume which is typically enclosed by some other structure, such as a suitable package.

It should also be noted that whilst FIGS. 1a and 1b shows the backplate being supported on the opposite side of the membrane to the substrate, arrangements are known where the backplate is formed closest to the substrate with the membrane layer supported above it.

In use, in response to a sound wave corresponding to a pressure wave incident on the microphone, the membrane is deformed slightly from its equilibrium or quiescent position. The distance between the membrane electrode 102 and the backplate electrode 103 is correspondingly altered, giving rise to a change in capacitance between the two electrodes that is subsequently detected by electronic circuitry (not shown).

The membrane layer and thus the flexible membrane of a MEMS transducer generally comprises a thin layer of a dielectric material—such as a layer of crystalline or polycrystalline material. The membrane layer may, in practice, be formed by several layers of material which are deposited in successive steps. Thus, the flexible membrane 101 may, for example, be formed from silicon nitride $Si_3N_4$ or polysilicon. Crystalline and polycrystalline materials have high strength and low plastic deformation, both of which are highly desirable in the construction of a membrane. The membrane electrode 102 of a MEMS transducer is typically a thin layer of metal, e.g. aluminium, which is typically located in the centre of the flexible membrane 101, i.e. that part of the membrane which displaces the most. It will be appreciated by those skilled in the art that the membrane electrode may be formed by depositing a metal alloy such as aluminium-silicon for example. The membrane electrode may typically cover, for example, around 40% of area of the membrane, usually in the central region of the membrane.

Thus, known transducer membrane structures are composed of two layers of different material—typically a dielectric layer (e.g. SiN) and a conductive layer (e.g. AlSi).

Typically the membrane layer 101 and membrane electrode 102 may be fabricated so as to be substantially planar in the quiescent position, i.e. with no pressure differential across the membrane, as illustrated in FIG. 1a. The membrane layer may be formed so as to be substantially parallel to the back-plate layer in this quiescent position, so that the membrane electrode 102 is parallel to the back-plate electrode 103. However, over time, the membrane structure may become deformed—e.g. as a consequence of relatively high or repeated displacement—so that it will not return to exactly the same starting position.

It will be appreciated that both the membrane and the membrane electrode will suffer intrinsic mechanical stress after manufacture. The composite membrane and membrane electrode structure is typically formed by deposition which takes place at high temperatures of around a few hundred degrees Celsius. On return to room temperature, and as a consequence of the membrane and membrane electrode having greatly different thermal coefficients of expansion, the two layers contract by different amounts. Since the two layers are intimately mechanically coupled together, thus preventing the dissipation of stress by independent mechanical contraction, thermal induced mechanical stress arises within the layers of the membrane and membrane electrode structure. Thus, even at equilibrium (when the pressure differential across the membrane is substantially zero) the composite structure will tend to deform as a result of the thermal induced stress. This is similar to the well-known operation of bi-metallic strip thermostat sensors.

FIG. 2 illustrates the permanent deformation which can occur to the quiescent position of the membrane 101/102. It can be seen that the quiescent position of the membrane, and thus the spacing between the back-plate electrode 103 and the membrane electrode 102, changes from its position immediately after manufacture—shown by the dashed line—to the deformed quiescent position. This can lead to a DC offset in the measurement signal from such a transducer, as the capacitance at the quiescent position is not the same. Furthermore, for a.c. audio signals, the change in capacitance leads to a variation in the signal charge for a given acoustic stimulus, i.e. the acousto-electrical sensitivity of the microphone. This change in capacitance is sometimes referred to as reflow drift.

The problem of reflow drift was considered in an earlier application filed by the present Applicant. Specifically, a MEMS transducer was disclosed in which the membrane electrode comprises at least one opening, wherein at least part of the area of the opening corresponds to the area of a back-plate hole in a direction normal to the membrane. In other words the area of at least part of the opening in the membrane electrode aligns (in a direction normal to the membrane) with at least part of the area of a back-plate hole. By providing such openings in the membrane electrode, the total amount of metal forming the membrane electrode can be reduced compared to a membrane electrode having a similar diameter but without any such openings. As a consequence, the reflow drift or metal creep that is demonstrated by the membrane and membrane electrode structure, and which is proportional to the area of metal provided on the surface of the membrane, is mitigated.

FIG. 3a illustrates a plan view of such a previously proposed MEMS transducer comprising a membrane electrode 302 formed on a flexible membrane 301. The membrane electrode 302 has a plurality of openings 313 in the electrode material 302 where there is no coverage of the membrane 301. These openings (or areas of absence) 313 reduce the amount of electrode material 302 which is deposited on the membrane 301 (for a given diameter of electrode) and therefore increase the proportion of membrane material to electrode material compared to the electrode without such openings. This results in a membrane structure 301/302 which has reduced plastic deformation.

However, although transducers comprising a patterned electrode are less susceptible to plastic deformation, they have still been shown to demonstrate a degree of change—or drift—in sensitivity over time. The level or degree of sensitivity drift is typically very small. However, more recent applications of MEMS microphones (e.g. the use of MEMS microphones within a beamforming array of microphones) may require new levels of performance stability.

The present disclosure invention relates to MEMS transducers and processes which seek to alleviate the occurrence of time-dependent sensitivity drift, by providing a transducer which exhibits has a reduced plastic deformation as compared to sheet electrode designs but which also demonstrate a more stable sensitivity or performance over time. In particular, examples described herein provide membrane electrode designs which seek to achieve a reduction in sensitivity drift over time.

SUMMARY OF EMBODIMENTS

According to an example embodiment of a first aspect there is provided a MEMS transducer comprising:
a flexible membrane;
a membrane electrode provided on a first surface of the flexible membrane, the membrane electrode comprising a layer of conductive material;
at least one opening formed in the membrane electrode; and
at least one conductive element that is provided on said first surface of the flexible membrane within the opening of the membrane electrode.

The conductive element may be connected to a peripheral edge of the opening formed in the membrane electrode such that the conductive element forms a part of the membrane electrode. Thus, the conductive element can be considered to project inwardly from the periphery of the opening, in a direction that has a component that extends towards the centre or a central region of the opening. The periphery of the opening defines the overall shape of the opening which may be, inter alia hexagonal, square or circular.

The conductive element may be generally elongate in form. The conductive element may comprise at least one loop of conductive material. The conductive element comprises a plurality of loops of conductive material, each loop having a different diameter and being provided concentrically within the opening. The plurality of loops may be electrically connected to each other and to the peripheral edge of the opening.

A plurality of conductive elements may be provided within the opening of the membrane electrode. Each conductive element may be connected to a different region of the peripheral edge of the opening. For example, the conductive elements may be spaced substantially equidistant around the peripheral edge of the opening.

According to an example embodiment of a second aspect there is provided a MEMS transducer comprising:
a flexible membrane;
a membrane electrode provided on a first surface of the flexible membrane,
a backplate electrode provided in a plane spaced relative to the membrane electrode and having at least one hole. The membrane electrode is provided with at least one void which at least partially underlies the hole in the backplate electrode. At least one conductive element is provided on said first surface of the flexible membrane within the void of the membrane electrode so as to underlie the hole in the backplate electrode.

According to an example embodiment of third aspect there is provided a MEMS transducer comprising:
a flexible membrane;
a conductive membrane electrode provided on a first surface of the flexible membrane;
at least one opening formed in the conductive membrane electrode; and
at least one conductive element that is provided on said first surface of the flexible membrane within the opening of the conductive membrane electrode.

According to an example embodiment of a fourth aspect there is provided a MEMS transducer comprising:

a conductive membrane electrode provided on a first surface of a flexible membrane;

at least one opening formed in the conductive membrane electrode; and at least one conductive element provided within the opening of the conductive membrane electrode.

Features of any given aspect may be combined with the features of any other aspect and the various features described herein may be implemented in any combination in a given embodiment.

Associated methods of fabricating a MEMS transducer are provided for each of the above aspects and examples described herein.

BRIEF DESCRIPTION OF THE DRAWINGS

For a better understanding of the present invention and to show how the same may be carried into effect, reference will now be made, by way of example, the accompanying drawings in which.

DETAILED DESCRIPTION

Figure 1A:
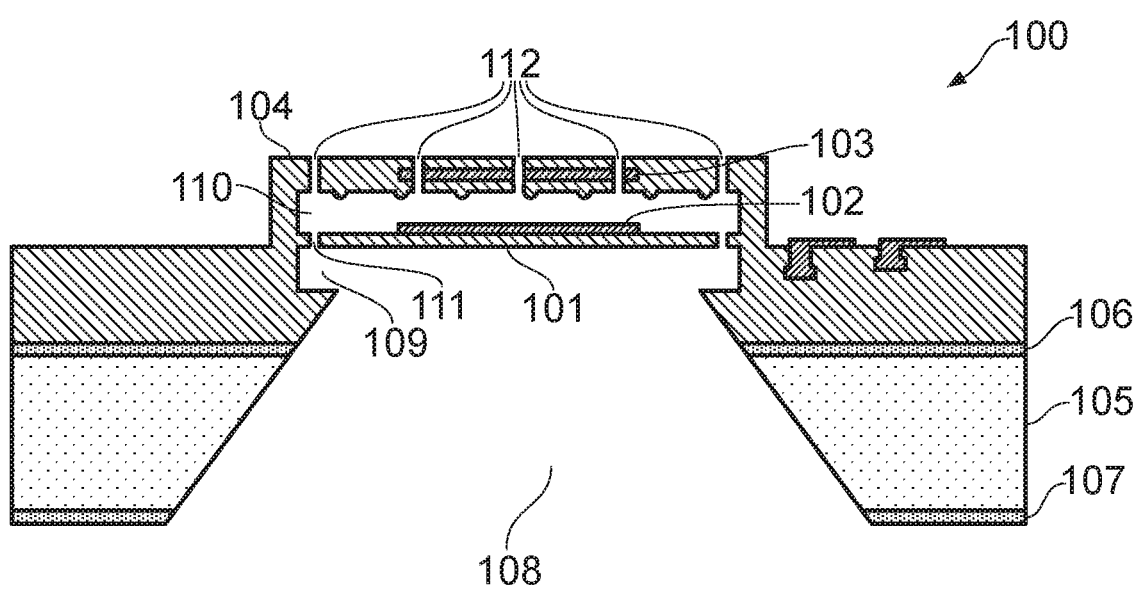
FIGS. 1a and 1b illustrate known capacitive MEMS transducers in section and perspective views.
Figure 1B:
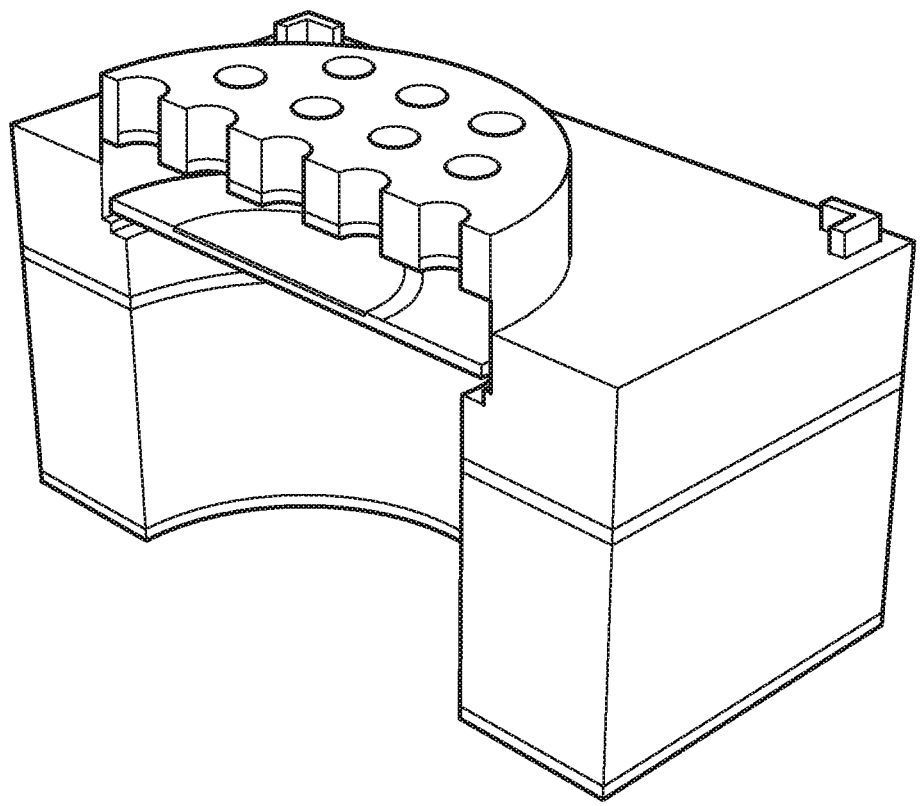
Figure 2:
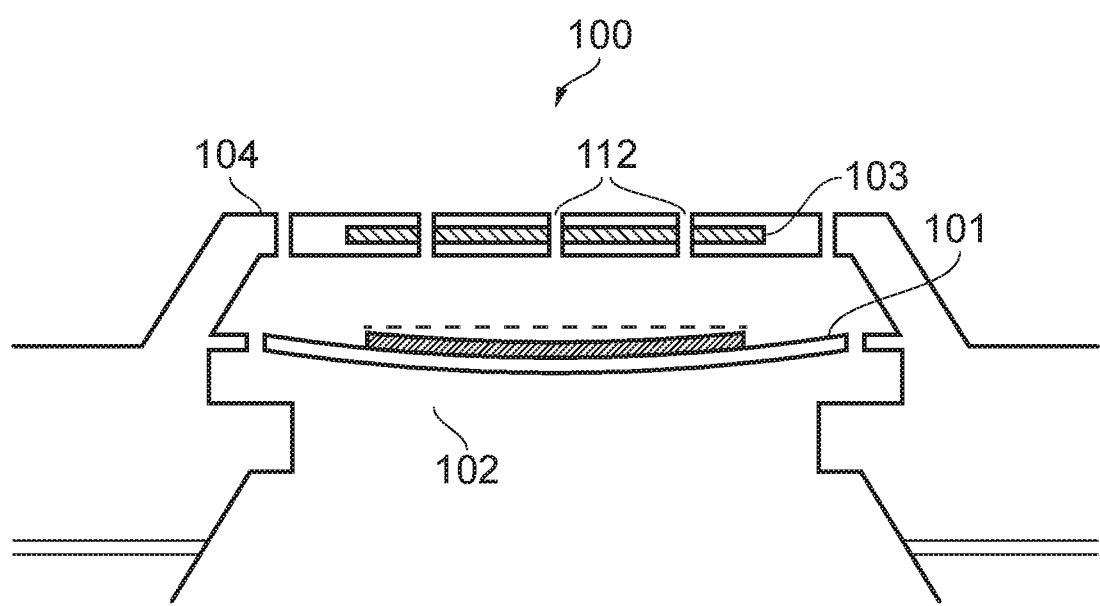
FIG. 2 illustrates how a membrane may be deformed.
Figure 3A:
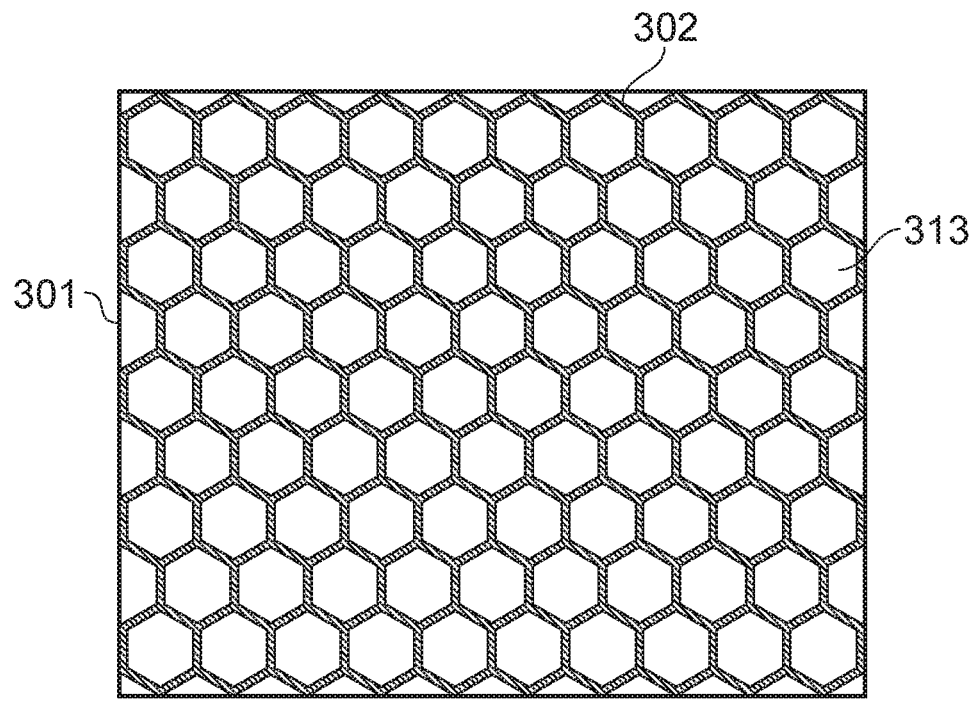
FIG. 3a illustrates a plan view of a previously considered membrane electrode structure that is patterned to incorporate openings.
Figure 3B:
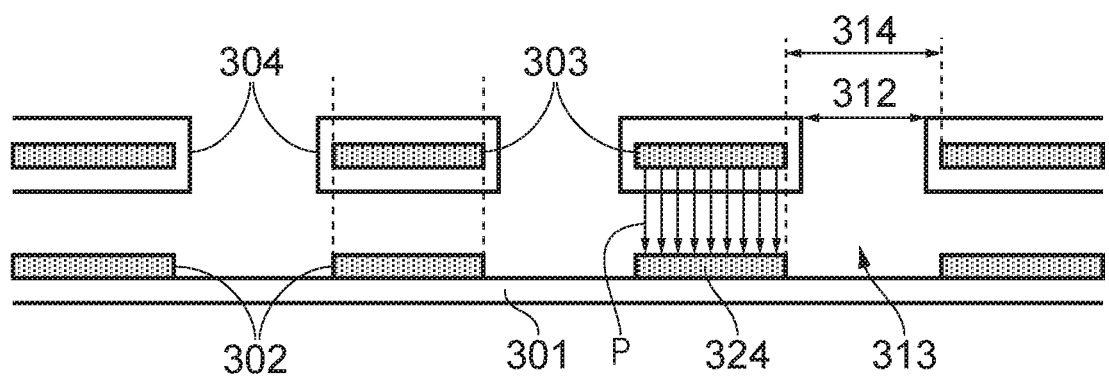
FIG. 3b illustrates a cross section through a membrane electrode structure that is patterned to incorporate openings.

FIG. 3b illustrates a part of a cross-section of the previously proposed transducer illustrated in FIG. 3a and additionally illustrates the backplate structure 304 in a plane above the membrane and membrane electrode structure. The backplate structure comprises a back-plate electrode 303. Acoustic holes 312 are provided through the backplate structure. These acoustic holes 312 allow acoustic communication between the cavity that is provided between the membrane and backplate and a volume on the other side of the membrane (which could be a sound port or a backvolume). The backplate electrode 303 is patterned to provide holes 314 which correspond to the acoustic holes.

The advantage of designing the membrane electrode to include openings—or regions devoid of membrane electrode material—is that less membrane electrode material is formed on the flexible membrane and thus the area of interface between the membrane and the membrane electrode material is less than in the case of a continuous sheet electrode design. This reduces the effect of the thermal induced stress between the layers and, consequently, the membrane and membrane electrode structure is less susceptible to plastic deformation.

As one skilled in the art will appreciate, and as illustrated in FIG. 3b, in a parallel plate capacitor which is charged/biased there will be an electrostatic field component P running from one plate to the other in a direction perpendicular to the plates. However in the areas of the acoustic holes there is no back-plate electrode and thus no perpendicular field component. As shown in FIG. 3b, the openings in the membrane electrode are beneficially located so as to substantially correspond, or at least partially underlie, the holes in the back-plate electrode. It will be appreciated that in areas directly underlying the backplate electrode holes there will be no perpendicular field component, even if there were membrane electrode material present, because of the absence of back-plate electrode. Thus, based on a simple analysis of the perpendicular field component of the electrostatic field that arises between the areas of the electrodes that are mutually parallel, the provision of openings in the membrane electrode in areas that directly underlie (i.e. areas within the membrane electrode layer that intersect a line drawn normal to backplate electrode hole) may be expected to have only a limited impact on the resulting capacitance of the sensor and hence on sensitivity of the sensor.

However, somewhat surprisingly, measurements of the capacitance arising between the membrane and backplate electrode according to such prior examples have demonstrated that the capacitance tends to change, i.e. increase, over time from an initial time $t_o$. In other words, although the permanent change in capacitance caused by the plastic deformation of the two-layer structure is mitigated by the reduction in metal area, a time-dependent drift in sensitivity may occur.

The present disclosure invention relates to MEMS transducers and processes which seek to alleviate the occurrence of time-dependent sensitivity drift, by providing a transducer which exhibits has a reduced plastic deformation as compared to sheet electrode designs but which also demonstrate a more stable sensitivity or performance over time. In particular, examples described herein provide membrane electrode designs which seek to achieve a reduction in sensitivity drift over time.

Figure 4:
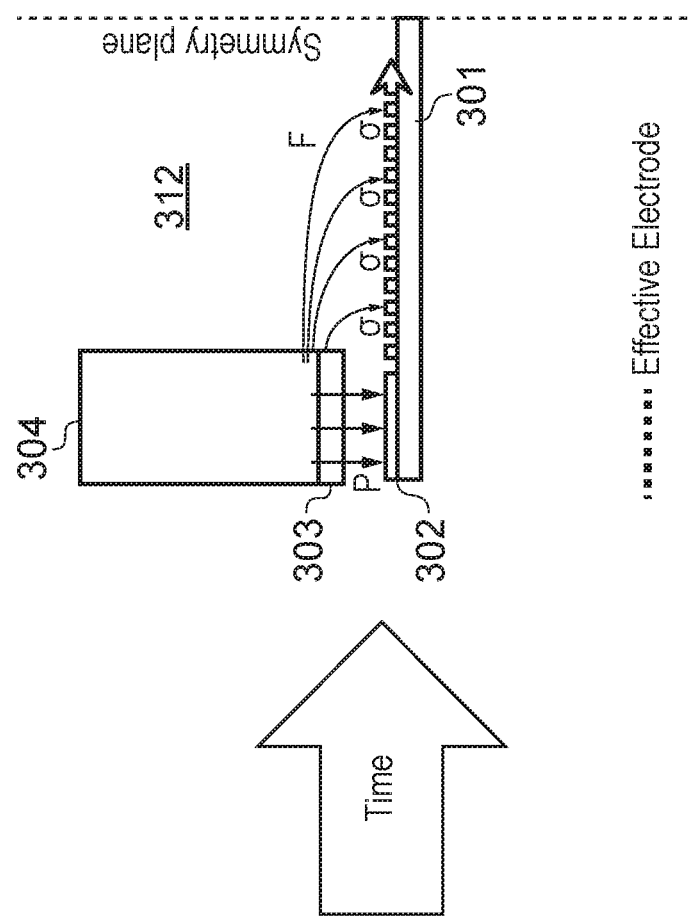
FIG. 4 illustrates the electrostatic field lines arising between a backplate electrode and a membrane electrode of a MEMS transducer.
Figure 4:
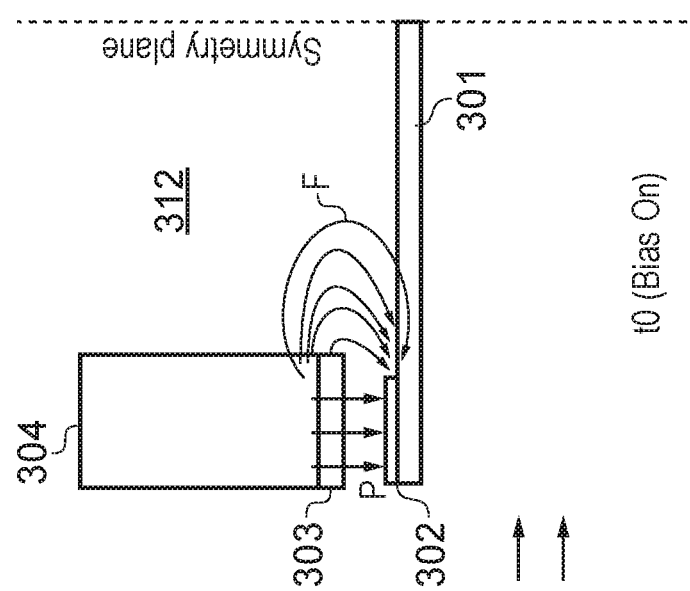

To understand why this dynamic drift in capacitance may arise, it is useful to consider a more complete analysis of the electrostatic fields arising in the airgap between the electrodes. In particular, as illustrated in FIG. 4, the present inventors have considered the effect of non-perpendicular fringing electrostatic fields F that extend from the edge of the backplate electrode (nearest the hole in the back-plate) to the edge of the underlying membrane electrode. Such fringing fields F may make a contribution to the capacitance and thus the sensitivity of the microphone. At an initial time, $t_o$, such fringing fields may only extend, i.e. bow, laterally for about 1-2 μm whilst the diameter of the electrode holes may be larger, for example of the order of about 10 μm or so in diameter. Thus, it has been generally understood that the contribution of the electrostatic fringing fields is relatively minimal.

As previously mentioned, the membrane of a MEMS transducer generally comprises a thin layer of a dielectric material, e.g. silicon or silicon nitride (SiN). Thus, in devoid membrane electrode regions corresponding to each of the openings in the membrane electrode, an area of underlying membrane material is exposed. It is hypothesised by the present inventors that unpassivated dangling bonds on the surface of this exposed membrane layer form electrically active charge traps and, thus, surface charges σ start to diffuse from the perimeter of the conductive electrode on the exposed areas of the flexible membrane material. It is further hypothesised that moisture present on the exposed surface may play a role in this charge diffusion. Furthermore, these surface charges σ are thought to gradually build up, effectively extending the membrane electrode into the region of the opening. The surface charges therefore contribute dynamically to the overall capacitance—and thus the sensitivity—of the transducer. It is therefore thought that the presence of exposed regions of membrane dielectric material gives rise to a secondary drift mechanism in examples of MEMS transducers which utilise a membrane electrode that is patterned to incorporate a plurality of openings.

Figure 5:
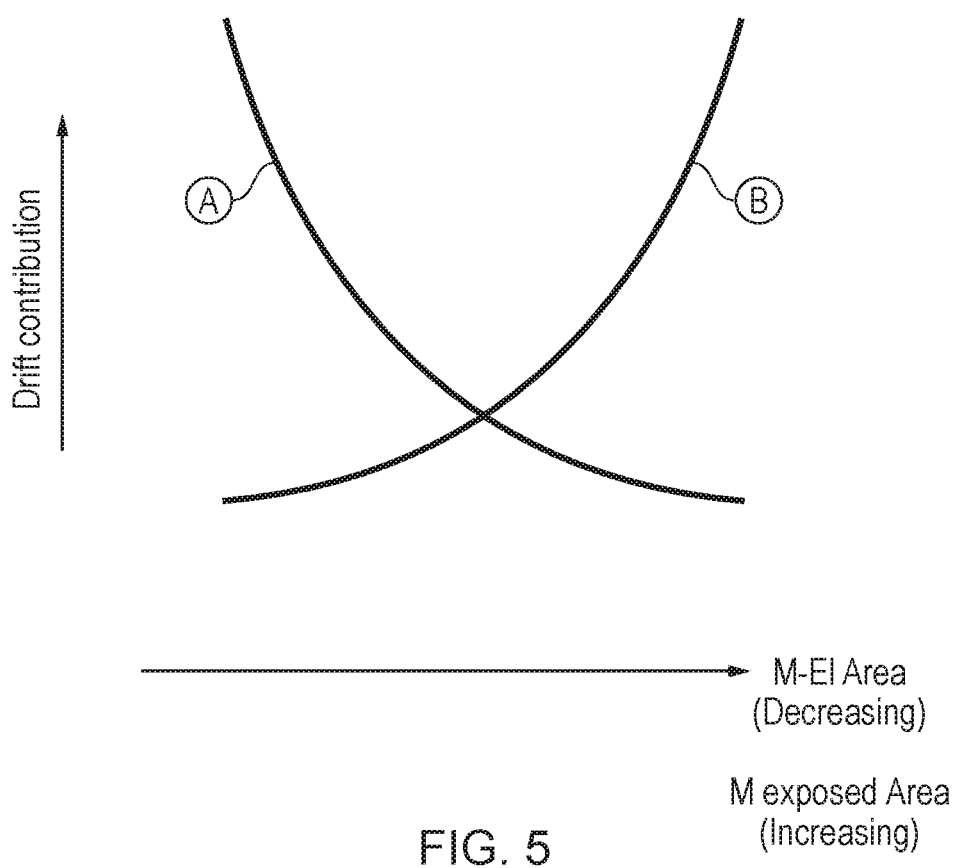
FIG. 5 provides two separate plots to illustrate the drift in capacitance due to plastic deformation of the membrane structure and accumulating surface charges on the exposed regions of the membrane layer.

FIG. 5 provides two separate plots to illustrate, relative to a decreasing membrane electrode area (and thus increasing exposed membrane area), the contribution of the drift in capacitance that arises due to plastic deformation of the membrane structure (plot A) and the contribution of the (time-dependent) drift in capacitance that arises due to, it is hypothesised, surface charges arising on the exposed regions of the membrane layer (plot B).

Examples described herein seek to provide a MEMS transducer having a modified membrane electrode that is preferably designed having regard for these two, competing, drift mechanisms. In particular, examples described herein seek to provide a MEMS transducer which seeks to mutually reduce or even minimise the drift in capacitance due to the thermally induced plastic deformation that is induced at the time of fabrication, as well as seeking to minimise the drift in capacitance that arises due to the build-up of surface charges on the exposed regions on the membrane layer during operation.

FIGS. 6a to 6g each illustrate a part of a membrane electrode according to various example embodiments.

Figure 6A:
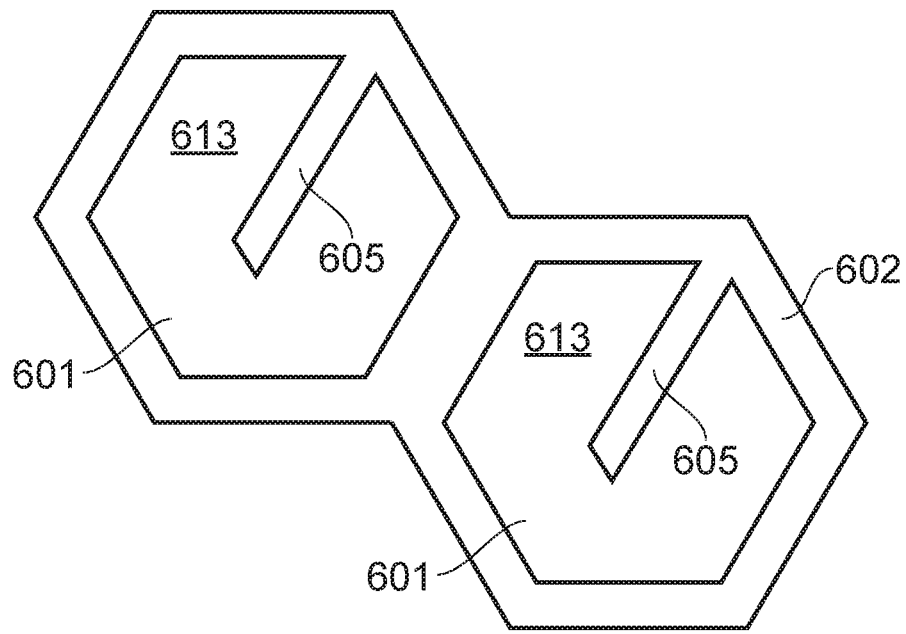
FIGS. 6a to 6g each illustrate a part of a membrane electrode according to various example embodiments.

FIG. 6a illustrates a part of a membrane electrode 602 formed on a flexible membrane 601 of a MEMS transducer according to first example embodiment. The membrane 601 and membrane electrode 602 together form a membrane structure. The membrane electrode 602 is formed of a conductive material such as metal and is provided with a plurality of hexagonal shaped openings 613 in the electrode material where there is no coverage of the membrane 601. Thus, the openings 613 expose a region of the underlying membrane material. These openings 613 in the membrane electrode (or areas of absence of membrane electrode material) reduce the amount of electrode material which is deposited on the membrane 601 resulting in a membrane structure 601/602 in which the plastic deformation induced during the fabrication of the membrane electrode structure due to the different thermal expansion coefficients of the materials is reduced. For simplicity, FIG. 6a illustrates only a part of the membrane electrode structure. However, it will be appreciated that the membrane electrode can be considered to exhibit a grid or lattice-like structure in which strips of electrode material form a pattern of open spaces (voids in membrane electrode material) between the strips. Thus, the membrane electrode can be considered to be an electrically continuous conductive layer having one or more perforations or apertures within the conductive layer. The openings may substantially correspond in shape and size to holes in an overlying backplate electrode (not shown).

The membrane electrode further comprises a conductive element 605 which is provided within the openings of the membrane electrode and extends within the plane of the membrane electrode 602. The conductive element 605 extends from a region of the peripheral edge of the opening and projects across the opening. The conductive element 605 may preferably be formed of the same material as the membrane electrode material and may be defined during the same fabrication step in which the openings are formed within the membrane electrode. As illustrated in FIG. 6a, the conductive element comprises an elongate projection. The conductive element 605 is connected to the periphery of the opening and thus forms a part of the membrane electrode 602.

It will be appreciated that conductive elements having various other designs are envisaged. For example, as shown in FIG. 6b, a conductive element 605 is provided which comprises an elongate projection portion and two branch portions which each extend laterally from the end of the elongate projection at an angle relative to the longitudinal axis of the elongate projection portion.

Figure 6B:
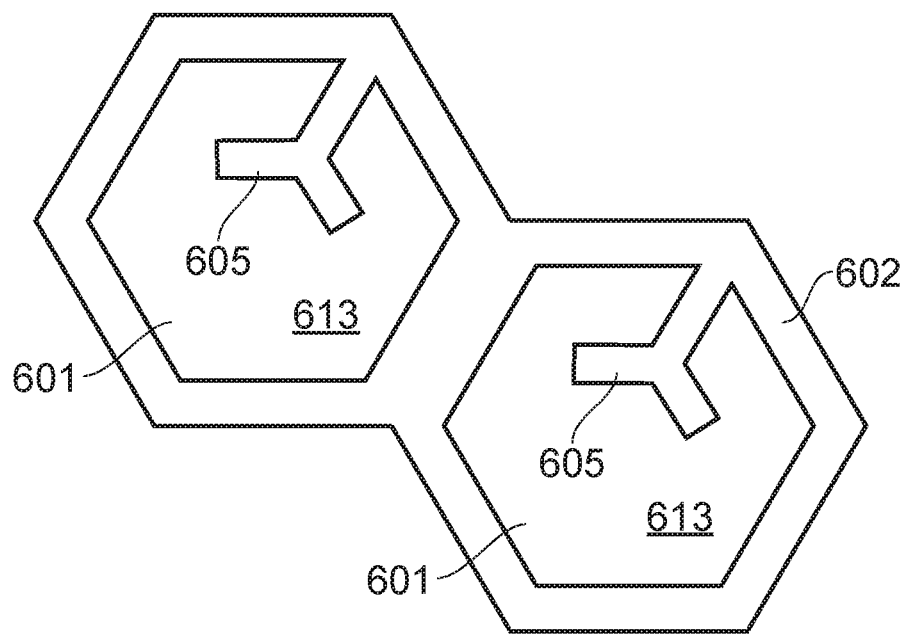
Figure 6C:
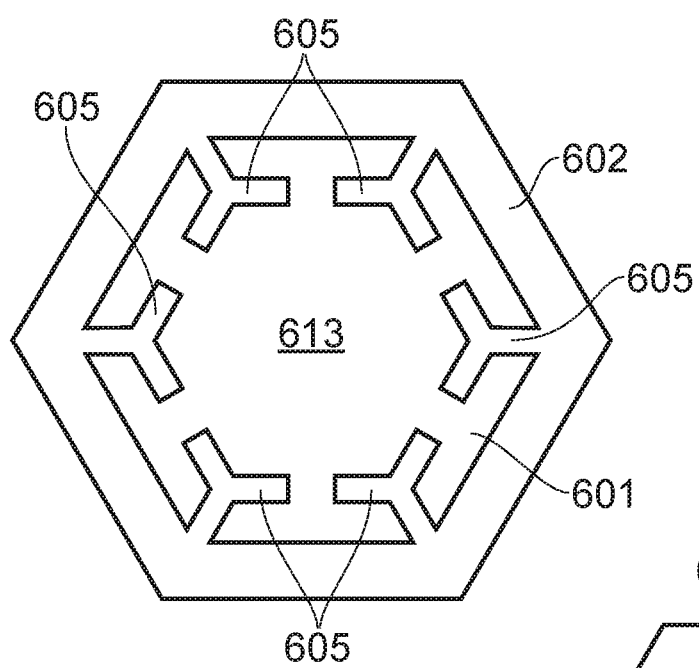

FIG. 6c illustrates an opening 601 of a membrane electrode, wherein six conductive elements 605—each similar in form to the conductive element illustrated in FIG. 6b—are arranged around the periphery of the opening 601. The conductive elements can be considered to define a broken hexagonal shape.

Figure 6D:
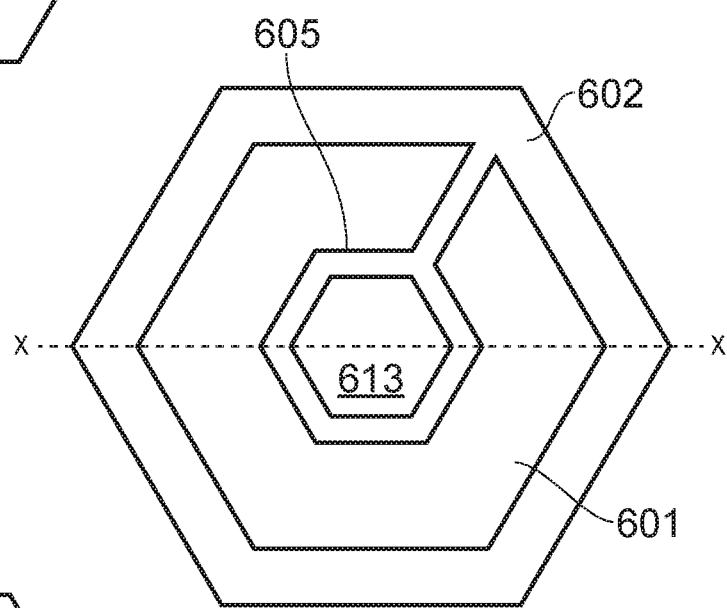

FIG. 6d illustrates a further example embodiment in which a single conductive element 605 in the form of a loop, or ring, is provided. In this example the loop is generally hexagonal in shape (i.e. substantially the same shape as the shape defined by the perimeter of the opening 601). However, it will be appreciated that a closed loop of any shape is envisaged including circular or regular/irregular polygon. In this example, the conductive element also comprises an elongate portion which serves to mechanically couple and electrically connect the loop to the membrane electrode material which forms the periphery of the opening.

Figure 6E:
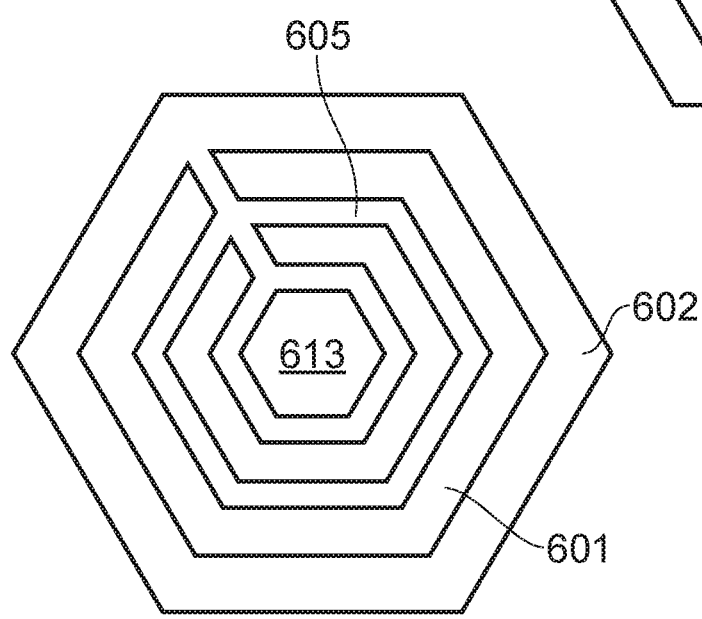

The conductive element 605 illustrated in FIG. 6e comprises two loops having different diameters which are arranged concentrically within the opening. Again, the conductive element also comprises an elongate portion which serves to mechanically couple and electrically connect the loop to the periphery of the opening.

Figure 6F:
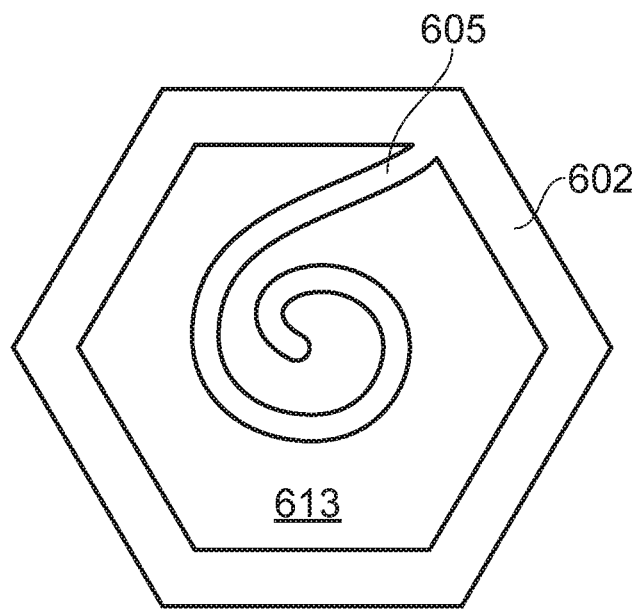
Figure 6G:
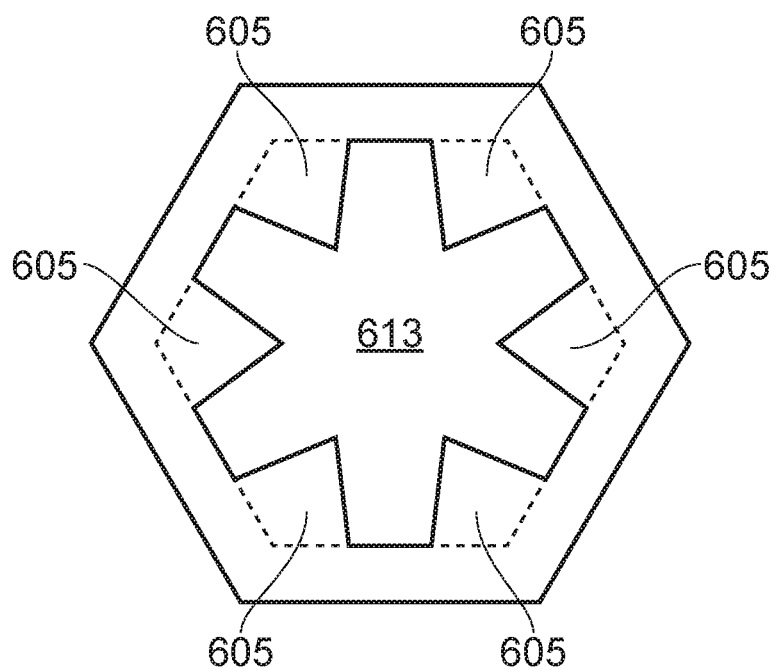

In FIG. 6f a spiral shape of conductive material forms the conductive element 605 wherein one end of the spiral adjoins the membrane electrode material that forms the periphery of the opening. A plurality of triangular shaped elements project from the inner vertices of the otherwise generally hexagonal opening as shown in FIG. 6g.

In the examples shown in FIGS. 6a to 6g, the conductive element—which is formed on the surface of the membrane and provided in the plane of the membrane electrode—projects inwardly from the peripheral edge of the opening. Thus, the conductive element(s) is connected to the membrane electrode material that defines the peripheral edge. Thus, the membrane electrode of the transducer can be considered to comprise a lattice-like structure comprising a plurality of strips of electrode material and a plurality of openings, wherein the openings form a pattern of spaces between the strips of electrode material and wherein the opening are provided with at least one said conductive element.

Figure 7A:
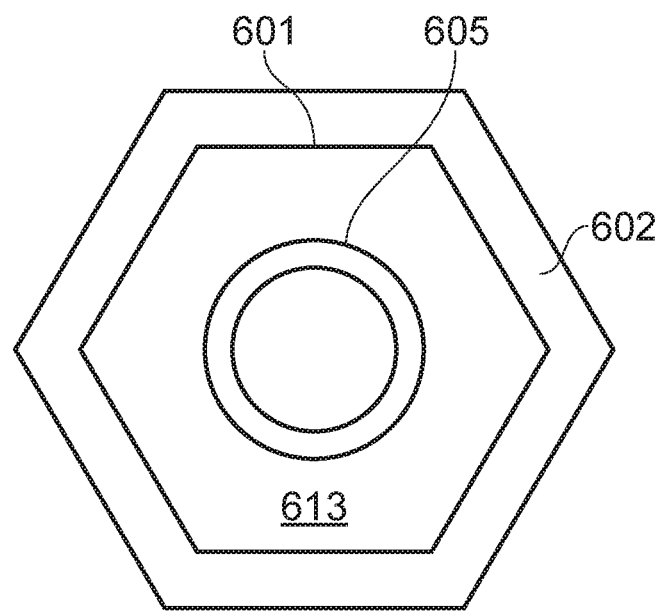
FIGS. 7a and 7b illustrate an opening formed in a membrane electrode according to further example embodiments.
Figure 7B:
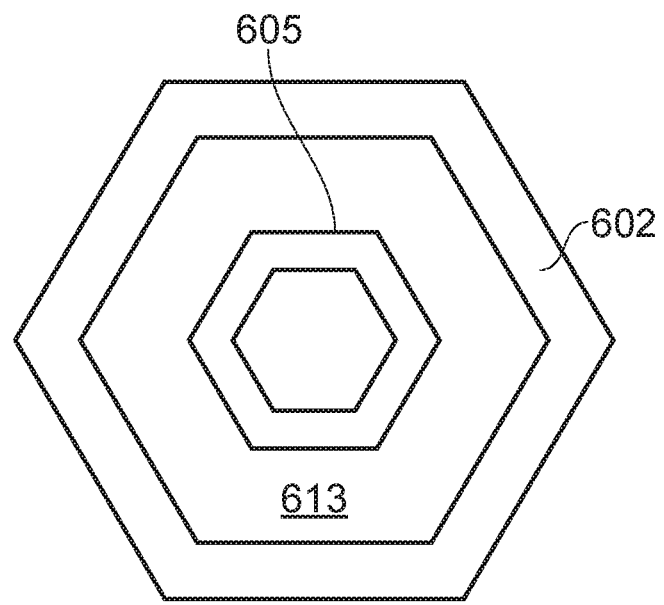

According to alternative embodiments, the conductive element is not connected to peripheral edge and is instead provided within the opening, in the plane of the membrane electrode and deposited on the surface of the membrane electrode. In this sense, the conductive element is provided separately (mechanically and electrically) to the membrane electrode. FIGS. 7a and 7b illustrate two examples of such embodiments. Specifically, as illustrated in FIG. 7a, a conductive element 605 in the form of a circular ring is provided within the opening 601 and is deposited on the surface of the underlying membrane 613 so as to be formed within the same plane as the membrane electrode 602. In FIG. 7*b* a discrete conductive element is provided in the form of a hexagonal loop.

It will be appreciated that whilst the general/overall shape of each of the openings illustrated in FIGS. 6*a* to 6*g* and FIGS. 7*a* and 7*b* is hexagonal, numerous other opening shapes are envisaged including square, rectangular, circular or polygonal (regular or irregular).

The provision of one or more electrically conductive elements within the openings(s) of the patterned membrane electrode layer beneficially serves to change the distribution of surface charges in the region of the exposed membrane and/or the speed at which surfaces charges will accumulate. This can be appreciated by considering the charge diffusion length and the fact that the charges will diffuse onto the exposed surface of the membrane from the perimeter of the conductive material. Thus, the provision of one or more electrically conductive elements within the openings of the patterned membrane electrode layer preferably results in a more even distribution of surface charges accumulating on the surface of the exposed membrane region. This, in turn, gives rise to a more uniform electrostatic field pattern and an increased capacitance. In effect, rather than relying on a slow diffusion process for the charges to occupy the opening in the conductor, the provision of the additional conductive element(s) effectively places charges where they would end up by diffusion and thereby shortens the distance that charges need to diffuse across the opening in order to cover the exposed surface. The additional conductive elements may be considered to act as a supplementary charge source within the region of the opening.

Examples described herein seek to provide a membrane electrode that has been designed such that the surface charging that arises on exposed regions of the membrane is more evenly distributed. Ideally, surface charges will be able to accumulate on the entire surface of the exposed membrane so that the electrostatic field pattern that arise sin the air gap (i.e. between the plane of the backplate electrode and the membrane electrode) is more closely similar to the field patterns that would arise in the case of a continuous sheet electrode (i.e. without perforations).

This can be achieved by having an appreciation of the charge diffusion length—i.e. distance that surface charges will tend to travel on the surface of the silicon dielectric membrane. Although the mechanisms by which surface charges are able to migrate on the surface of the membrane are not yet fully understood, simulations have confirmed that the charges more readily accumulate on the exposed surface of the membrane in close proximity to the conductive material.

Examples described herein are based on the recognition that by modifying the contribution of the fringing field—i.e. by optimising the design of the membrane electrode patterning—it is beneficially possible to provide a MEMS transducer in which the amount of charge stored at t=o closer to the amount of charge accumulated over time. Beneficially, therefore, the charge accumulation can be accurately predicted.

Example embodiments described herein may benefit from a reduction in the time dependent drift in capacitance that arises in the case of patterned or lattice-like membrane electrode designs.

A transducer comprising a membrane structure according to examples of the present embodiments will preferably be provided with a backplate structure which supports a backplate electrode. As previously discussed, the backplate and backplate electrode are provided with acoustic holes to allow free movement of air molecules through the back plate. According to preferred examples of the present embodiments, the location of the acoustic holes in the back-plate and the back-plate electrode correspond to the location of the openings in the membrane electrode (or vice versa). By correspond it is meant that the position of the openings in the membrane will be substantially the same as the position of the holes in the back-plate electrode as viewed from a direction normal to the membrane (or backplate electrode). Therefore were the acoustic holes of the backplate electrode to be projected onto the membrane electrode in such a direction, then the areas of the projected holes would substantially map on to the notional area (i.e. the area defined by the notional perimeter) of the openings in the membrane electrode.

Figure 8:
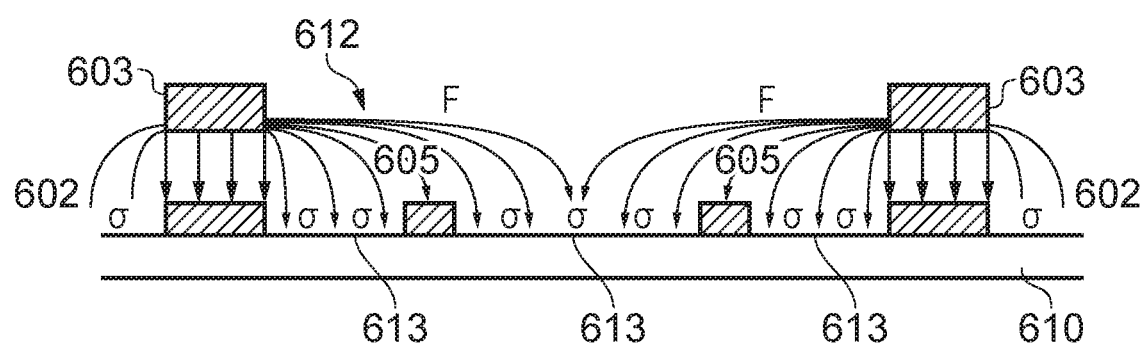
FIG. 8 illustrates a cross-sectional view through the line X-X shown in FIG. 6d.

FIG. 8 illustrates a cross-sectional view through the line X-X shown in FIG. 6*d* and further illustrates the relative position of the overlying backplate electrode 603. Specifically, the backplate electrode 603 is provided with a hole 612 which substantially overlies the opening 601 formed within the membrane electrode layer 602. The opening exposes a region 613 of the underlying membrane layer 610. Thus, from consideration of FIG. 8 it can be appreciated that the conductive element 605 is provided in the region underlying the corresponding hole in the backplate electrode. It can also be appreciated that the conductive element 605 advantageously reduces the distance between the regions of the conductive metal that forms the membrane electrode layer.

Figure 9A:
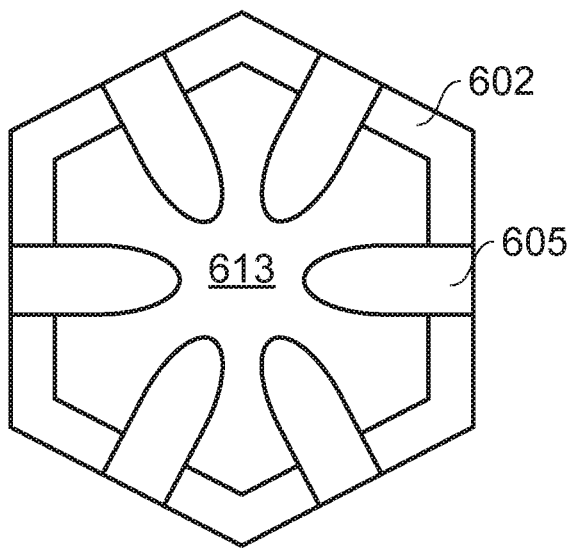
FIGS. 9a and 9b each illustrate part of a membrane electrode according to further example embodiments.
Figure 9B:
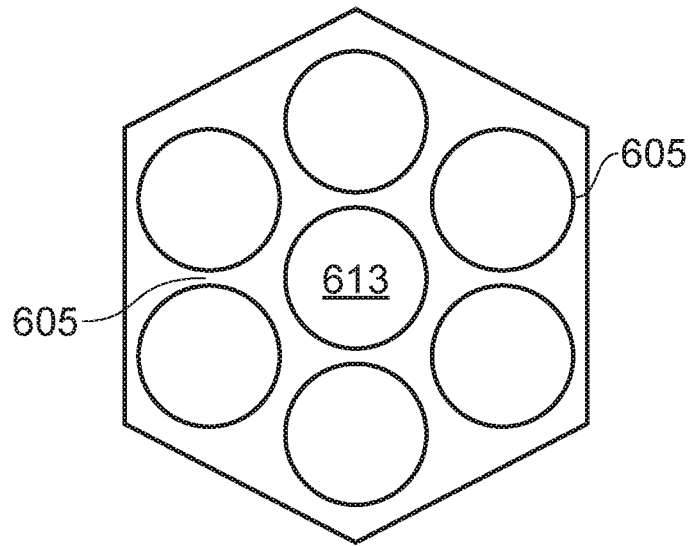

FIGS. 9*a* and 9*b* illustrate further example embodiments. Specifically, as illustrated in FIG. 9*a*, a plurality of conductive elements 605 are provided within a hexagonal shaped opening, each conductive element extending inwardly from a respective straight edge of the hexagonal opening. In FIG. 9*b* an example embodiment is illustrated in which a plurality of conducive elements (each conductive element extending from a different region—i.e. straight edge—of the periphery of the opening) form an interconnected sub-lattice within the opening region that is defined by the main hexagonal lattice of the membrane electrode. The sub-lattice defines a plurality of circular sub-openings, or sub voids, which reveal the underlying membrane electrode 613.

Patterning the membrane electrode of a MEMS transducer with one or more openings can be advantageous in reducing the overall amount of membrane electrode which alleviates the interface stresses arising due to the mechanical coupling of the membrane and membrane electrode—which are formed of materials having different thermal expansion coefficients. Furthermore, by providing one or more additional conductive elements within the openings of the membrane electrode, it is beneficially possible to generate a more uniform electrostatic field distribution. Thus, further benefits can be achieved in terms of reducing the likelihood of a change or drift in the sensitivity of the transducer over time, for example by designing the membrane electrode such that the surface charge distribution is relatively stable from a time at or very soon after manufacture.

In particular, according to example embodiments the fringe capacitance (i.e. the capacitance that arises due to fringe fields) approaches the equivalent solid planar capacitance (i.e. the capacitance that would arise if the membrane electrode were a continuous plane of conductive material without openings), whilst the interface area between the membrane and the membrane electrode, and thus the plastic deformation of the membrane structure due to thermal stresses induced at manufacture, is reduced.

The flexible membrane may comprise a crystalline or polycrystalline material, such as one or more layers of silicon-nitride $Si_3N_4$ and the membrane electrode may comprise a metal, such as aluminium, titanium, gold or copper, or alloys thereof.

The MEMS transducer will typically be associated with circuitry for processing an electrical signal generated by a variation in the capacitance measured between the two electrodes. Thus, in order to process an electrical output signal from the microphone, the transducer die/device may have circuit regions that are integrally fabricated using standard CMOS processes on the transducer substrate.

The circuit regions may be fabricated in the CMOS silicon substrate using standard processing techniques such as ion implantation, photomasking, metal deposition and etching. The circuit regions may comprise any circuit operable to interface with a MEMS microphone and process associated signals. For example, one circuit region may be a pre-amplifier connected so as to amplify an output signal from the microphone. In addition another circuit region may be a charge-pump that is used to generate a bias, for example 10 volts, across the two electrodes. This has the effect that changes in the electrode separation (i.e. the capacitive plates of the microphone) change the MEMS microphone capacitance; assuming constant charge, the voltage across the electrodes is correspondingly changed. A pre-amplifier, preferably having high impedance, is used to detect such a change in voltage.

The circuit regions may optionally comprise an analogue-to-digital converter (ADC) to convert the output signal of the microphone or an output signal of the pre-amplifier into a corresponding digital signal, and optionally a digital signal processor to process or part-process such a digital signal. Furthermore, the circuit regions may also comprise a digital-to-analogue converter (DAC) and/or a transmitter/receiver suitable for wireless communication. However, it will be appreciated by one skilled in the art that many other circuit arrangements operable to interface with a MEMS transducer signal and/or associated signals, may be envisaged.

It will also be appreciated that, alternatively, the microphone device may be a hybrid device (for example whereby the electronic circuitry is totally located on a separate integrated circuit, or whereby the electronic circuitry is partly located on the same device as the microphone and partly located on a separate integrated circuit) or a monolithic device (for example whereby the electronic circuitry is fully integrated within the same integrated circuit as the microphone).

Examples described herein may be usefully implemented in a range of different material systems, however the examples described herein are particularly advantageous for MEMS transducers having membrane layers comprising silicon nitride.

It is noted that the example embodiments described above may be used in a range of devices, including, but not limited to: analogue microphones, digital microphones, pressure sensor or ultrasonic transducers. The example embodiments may also be used in a number of applications, including, but not limited to, consumer applications, medical applications, industrial applications and automotive applications. For example, typical consumer applications include portable audio players, laptops, mobile phones, PDAs and personal computers. Example embodiments may also be used in voice activated or voice controlled devices. Typical medical applications include hearing aids. Typical industrial applications include active noise cancellation. Typical automotive applications include hands-free sets, acoustic crash sensors and active noise cancellation.

Features of any given aspect or example embodiment may be combined with the features of any other aspect or example embodiment and the various features described herein may be implemented in any combination in a given embodiment.

Associated methods of fabricating a MEMS transducer are provided for each of the example embodiments.

It should be understood that the various relative terms above, below, upper, lower, top, bottom, underside, overlying, underlying, beneath, etc. that are used in the present description should not be in any way construed as limiting to any particular orientation of the transducer during any fabrication step and/or it orientation in any package, or indeed the orientation of the package in any apparatus. Thus the relative terms shall be construed accordingly.

In the examples described above it is noted that references to a transducer may comprise various forms of transducer element. For example, a transducer may be typically mounted on a die and may comprise a single membrane and back-plate combination. In another example a transducer die comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprise different individual transducers positioned to receive acoustic signals from different acoustic channels.

It is noted that in the examples described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. The examples are also intended embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfill the functions of several units recited in the claims. Any reference signs in the claims shall not be construed so as to limit their scope.

The invention claimed is:

1. A MEMS transducer comprising:
   a flexible membrane;
   a membrane electrode provided on a first surface of the flexible membrane, the membrane electrode comprising a layer of conductive material;
   at least one opening formed in the membrane electrode; and
   at least one conductive element that is provided on said first surface of the flexible membrane within the opening of the membrane electrode, wherein the conductive element is connected to the membrane electrode at a peripheral edge of the opening formed in the membrane electrode.

2. A MEMS transducer as claimed in claim 1, wherein the conductive element comprises one or more of an elongate element, a triangular-shaped element and a spiral-shaped element.

3. A MEMS transducer as claimed in claim 2, wherein the conductive element comprises an elongate element and wherein the elongate element further comprises at least one branch of conductive material which extends laterally from a longitudinal axis of the elongate element within the plane of the membrane electrode.

4. A MEMS transducer as claimed in claim 1, wherein the conductive element comprises at least one loop of conductive material.

5. A MEMS transducer as claimed in claim 4, wherein the loop of conductive material defines one or more of a circular ring or a closed polygon shape.

6. A MEMS transducer as claimed in claim 4, wherein a shape of the loop is substantially the same as the shape defined by a peripheral edge of the opening.

7. A MEMS transducer as claimed in claim 4, wherein the conductive element comprises a plurality of loops of conductive material, each loop having a different diameter and being provided concentrically within the opening.

8. A MEMS transducer as claimed in claim 7, wherein the plurality of loops are electrically connected to each other and to the peripheral edge of the opening.

9. A MEMS transducer as claimed in claim 1, wherein a plurality of conductive elements are provided, each conductive element being connected to a different region of the peripheral edge of the opening.

10. A MEMS transducer as claimed in claim 9, wherein the conductive elements are spaced substantially equidistant around the peripheral edge of the opening.

11. A MEMS transducer as claimed in claim 9, wherein the conductive elements form an interconnected conductive sub-lattice, wherein the sub-lattice defines a plurality of sub-openings.

12. A MEMS transducer as claimed in claim 1, wherein the at least one opening exhibits a shape that is generally hexagonal, circular, square or rectangular.

13. A MEMS transducer as claimed in claim 1, wherein the membrane electrode comprises a lattice-like structure comprising a plurality of strips of electrode material and a plurality of openings, wherein the openings form a pattern of spaces between the strips of electrode material and wherein one or a plurality of the openings is provided with at least one said conductive element.

14. A MEMS transducer as claimed in claim 1, further comprising:

a backplate comprising a back-plate electrode, the back-plate electrode having a plurality of holes corresponding to a plurality of back-plate holes through the backplate;

wherein the opening formed in the membrane electrode at least partially underlies a corresponding hole in the backplate electrode.

15. A MEMS transducer as claimed in claim 14, wherein the area of said opening formed in the membrane electrode substantially corresponds to the area of the corresponding hole in the backplate electrode, in a direction normal to the membrane.

16. A MEMS transducer as claimed in claim 14, wherein one or more of the shape and size of said opening in the membrane electrode is substantially the same shape and size respectively as the corresponding hole in the backplate electrode.

17. A MEMS transducer as claimed in claim 14, wherein perimeter of the backplate hole substantially maps onto the perimeter of the corresponding opening in the membrane electrode when projected onto the plane of the membrane electrode in a direction normal to the membrane.

18. A MEMS transducer as claimed in claim 14, wherein the conductive element is provided so as to underlie the hole in the backplate electrode.

19. A MEMS transducer as claimed in claim 1, wherein the membrane electrode comprises metal or a metal alloy such as aluminium alloy.

20. A MEMS transducer as claimed in claim 1, further comprising readout circuitry, wherein the readout circuitry may comprise analogue and/or digital circuitry.

21. An electronic device comprising a MEMS transducer as claimed in claim 1, wherein said device is at least one of: a portable device; a battery powered device; an audio device; a computing device; a communications device; a personal media player; a mobile telephone; a games device; and a voice controlled device.

22. A MEMS transducer comprising:

a flexible membrane;

a membrane electrode provided on a first surface of the flexible membrane;

a backplate electrode provided in a plane spaced relative to the membrane electrode and having at least one hole;

wherein the membrane electrode is provided with at least one void which at least partially underlies the hole in the backplate electrode;

at least one conductive element that is provided on said first surface of the flexible membrane within the void of the membrane electrode so as to underlie the hole in the backplate electrode.

* * * * *